(12) United States Patent
Maheshwari

(10) Patent No.: US 6,417,696 B1
(45) Date of Patent: Jul. 9, 2002

(54) INTERFACE CIRCUIT FOR MIXED VOLTAGE I/O BUFFER TO PROVIDE GATE OXIDE PROTECTION

(75) Inventor: Sanjeev Kumar Maheshwari, Rajasthan (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/728,350

(22) Filed: Dec. 1, 2000

Related U.S. Application Data
(60) Provisional application No. 60/172,859, filed on Dec. 20, 1999.

(51) Int. Cl.[7] .................................... H03K 19/0185
(52) U.S. Cl. ......................... 326/81; 326/86; 326/80; 326/56; 327/333
(58) Field of Search .................... 326/80, 81, 83, 326/56–57; 327/333; 361/56, 90–91

(56) References Cited

U.S. PATENT DOCUMENTS

| 5,128,560 A | | 7/1992 | Chern et al. ............... 307/475 |
|---|---|---|---|
| 5,300,832 A | * | 4/1994 | Rogers ....................... 307/475 |
| 5,378,943 A | | 1/1995 | Dennard ..................... 326/68 |
| 5,570,043 A | * | 10/1996 | Churchill .................... 326/81 |
| 5,864,245 A | * | 1/1999 | Wararai ...................... 326/81 |
| 5,880,603 A | * | 3/1999 | Shigehara et al. ............ 326/81 |
| 5,892,371 A | * | 4/1999 | Maley ........................ 326/81 |
| 5,903,142 A | | 5/1999 | Mann ......................... 323/313 |
| 5,929,656 A | | 7/1999 | Pagones ...................... 326/83 |
| 5,933,025 A | | 8/1999 | Nance et al. ................. 326/81 |
| 6,005,413 A | | 12/1999 | Schmitt ...................... 326/80 |
| 6,040,729 A | | 3/2000 | Sanchez et al. ............... 327/309 |

OTHER PUBLICATIONS

Cypress Preliminary Ultra37000™ CPLD Family, 5V, 3.3V, ISR High–Performance CPLDs, Cypress Semiconductor Corporation, Aug. 13, 1999, pp. 1–65.

* cited by examiner

Primary Examiner—Michael Tokar
Assistant Examiner—Vibol Tan
(74) Attorney, Agent, or Firm—Christopher P. Maiorana, P.C.

(57) ABSTRACT

An apparatus comprising a first circuit and a second circuit. The first circuit may be configured to generate an output signal having a first voltage level and a first control signal in response to (i) an input signal having a second voltage level, (ii) an enable signal, and (iii) a plurality of node voltages. The second circuit may be configured to generate the plurality of node voltages in response to the first control signal. The first circuit may be configured to limit the first voltage level.

19 Claims, 5 Drawing Sheets

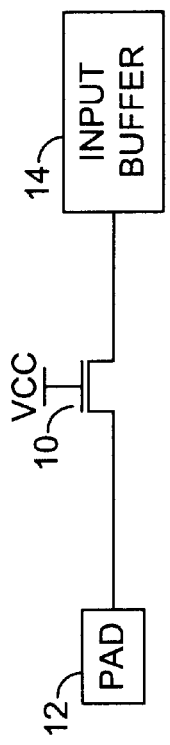
FIG. 1
(CONVENTIONAL)

INTERFACE CIRCUIT FOR MIXED VOLTAGE I/O BUFFER TO PROVIDE GATE OXIDE PROTECTION

This application claims the benefit of U.S. Provisional Application No. 60/172,859, filed Dec. 20, 1999 and is hereby incorporated by reference in its entirety.

FIELD OF THE INVENTION

The present invention relates to input/output buffers generally and, more particularly, to an interface circuit for providing gate oxide over-voltage protection to a mixed voltage I/O buffer.

BACKGROUND OF THE INVENTION

The trend in modern central processing units (CPUs) and microprocessors is to reduce the power supply operating voltage in order to reduce power consumption and increase chip density. Power supply reduction may impact other performance considerations. Due to design considerations, memory devices, such as dynamic random access memories (DRAMs), may operate at a different supply voltage than the CPU. Some devices also may be required to use more than one power supply voltage. For example, a CPU related device can respond to a signal at one voltage while other devices require another voltage. The signals can be generated by one circuit and received by another circuit.

One such configuration occurs with modern microprocessors that operate with a nominal power supply voltage of about 2.5V (or lower) while other circuits in the computer operate with a power supply voltage of about 3.3V. To facilitate communication between devices operating at different voltages, an input/output driver circuit is used.

Referring to FIG. 1, a diagram illustrating a conventional method of limiting an input voltage level to an input buffer is shown. In the conventional method, an NMOS transistor 10 is placed in series between a pad 12 and an input buffer 14. The gate of the NMOS transistor 10 is connected to a supply voltage VCC. The use of the NMOS transistor 10 to limit voltage can degrade voltage levels at the input terminal of the input buffer.

The degraded voltage levels can result in increased static and dynamic currents in the input buffer 14. Such a degration is especially true in an input buffer designed in low voltage technologies (e.g., 2.5V or less) since the threshold voltage does not scale proportionately with voltage. The voltage degradation will reduce the noise margin for the input buffer 14. The NMOS transistor needs a thick gate oxide requiring dual gate oxide technology.

It would be desirable to provide an interface block between the PAD 12 and the input buffer 14. Such an interface block would preferably take all the input voltage from 0V to >=Vcc+|vtp|(voltages >=Vcc+|Vtp| seen as an overvoltage condition) as seen at PAD 12 and output a voltage from 0v to Vcc. Such an interface should not draw undesired large (>1μA) currents from the PAD 12 or components (e.g., an input/output buffer).

SUMMARY OF THE INVENTION

The present invention concerns an apparatus comprising a first circuit and a second circuit. The first circuit may be configured to generate an output signal having a first voltage level and a first control signal in response to (i) an input signal having a second voltage level, (ii) an enable signal, and (iii) a plurality of node voltages. The second circuit may be configured to generate the plurality of node voltages in response to the first control signal. The first circuit may be configured to limit the first voltage level.

The objects, features and advantages of the present invention include providing an interface circuit for a mixed voltage I/O buffer that may (i) provide gate oxide protection, (ii) have no active voltage degradation, (iii) reduce static and dynamic currents, (iv) maintain a comparable noise margin in a low voltage circuit, (v) use different overvoltage detection thresholds for input and output buffer operation, (vi) provide early detection of an overvoltage condition at an input pad for an input buffer operation, (vii) provide sufficient safety margin for voltage level across an input buffer's gate oxide, (viii) provide early detection of an overvoltage condition that may compensate for the delay of overvoltage detection, (ix) provide improved speed of overvoltage detection, (x) provide fast removal of residual stored charge, (xi) reduce gate oxide stresses and improve circuit recovery from an over voltage condition, (xii) fit well for both input and output buffers, and/or (xiii) operate equally well for a number of voltage differences (e.g., 2.5V–3.3V, 1.8V–2.5V, etc.).

BRIEF DESCRIPTION OF THE DRAWINGS

These and other objects, features and advantages of the present invention will be apparent from the following detailed description and the appended claims and drawings in which:

FIG. 1 is a block diagram of a conventional method to limit a voltage presented to an input buffer;

DETAILED DESCRIPTION OF THE PREFERRED EMBODIMENTS

Figure 2:
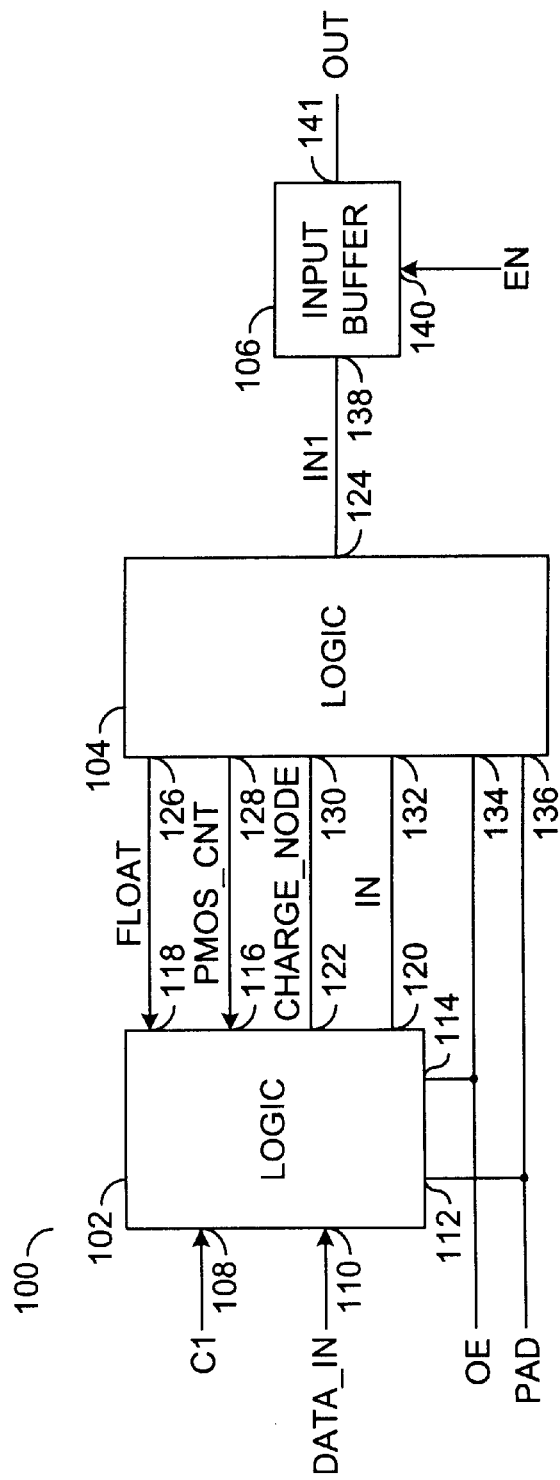
FIG. 2 is a block diagram of a preferred embodiment of the present invention.

Referring to FIG. 2, a block diagram of a circuit 100 is shown in accordance with a preferred embodiment of the present invention. The circuit 100 may be implemented, in one example, as an interface circuit for a mixed voltage I/O buffer. The circuit 100 may provide gate oxide protection.

The circuit 100 generally comprises a logic circuit 102, a logic circuit 104 and an input buffer 106. The logic circuit 102 may be implemented, in one example, as an output buffer. The output buffer 102 and the input buffer 106 may be implemented in combination, in one example, as an input/output buffer. The logic circuit 102 may have an input 108 that may receive a signal (e.g., C1), an input 110 that may receive a signal (e.g., DATA$_{13}$ IN), an output 112 that may connect to a node or present a signal (e.g., PAD), an input 114 that may receive a signal (e.g., OE), an input 116 that may receive a signal (e.g., PMOS$_{13}$ CNT) and an input 118 that may receive a signal (e.g., FLOAT). The circuit 102 may also have an connection 120 that may present/receive a signal or node (e.g., IN) and an connection 122 that may present/receive a signal or node (e.g., CHARGE$_{13}$ NODE). In one example, the signal CHARGE$_{13}$ NODE and the signal IN may be common nodes connected between the logic circuit 102 and the logic circuit 104.

The logic circuit 104 may have an output 124 that may present a signal or node IN1, an output 126 that may present the signal FLOAT and an output 128 that may present the signal PMOS$_{13}$ NT. The logic circuit 104 may also have a connection 130 that may present/receive the signal or node CHARGE$_{13}$ NODE and a connection 132 that may present/receive the signal or node IN. The 5 logic circuit 104 may also have an input 134 that may receive the signal OE and an input 136 that may receive the signal PAD.

The input buffer 106 may have a connection 138 that may receive the signal or node IN1 and an input 140 that may receive a signal (e.g., EN). The input buffer 106 may also have an output 141 that may present a signal (e.g., OUT).

The signal EN may be an enable signal presented to the input buffer 106. The signal OE may be an output enable signal (or control signal) presented to the logic circuit 102 and the logic circuit 104. The signal PAD may be a pad voltage received from or presented to an external device (not shown). The signal DATA$_{13}$ IN may be a data input signal. The signal C1 may be a control signal. The signal FLOAT, the signal IN, the signal PMOS$_{13}$ CNT and the signal CHARGE$_{13}$ NODE may be control voltages that may be used to control the operation of the circuit 100.

Figure 3:
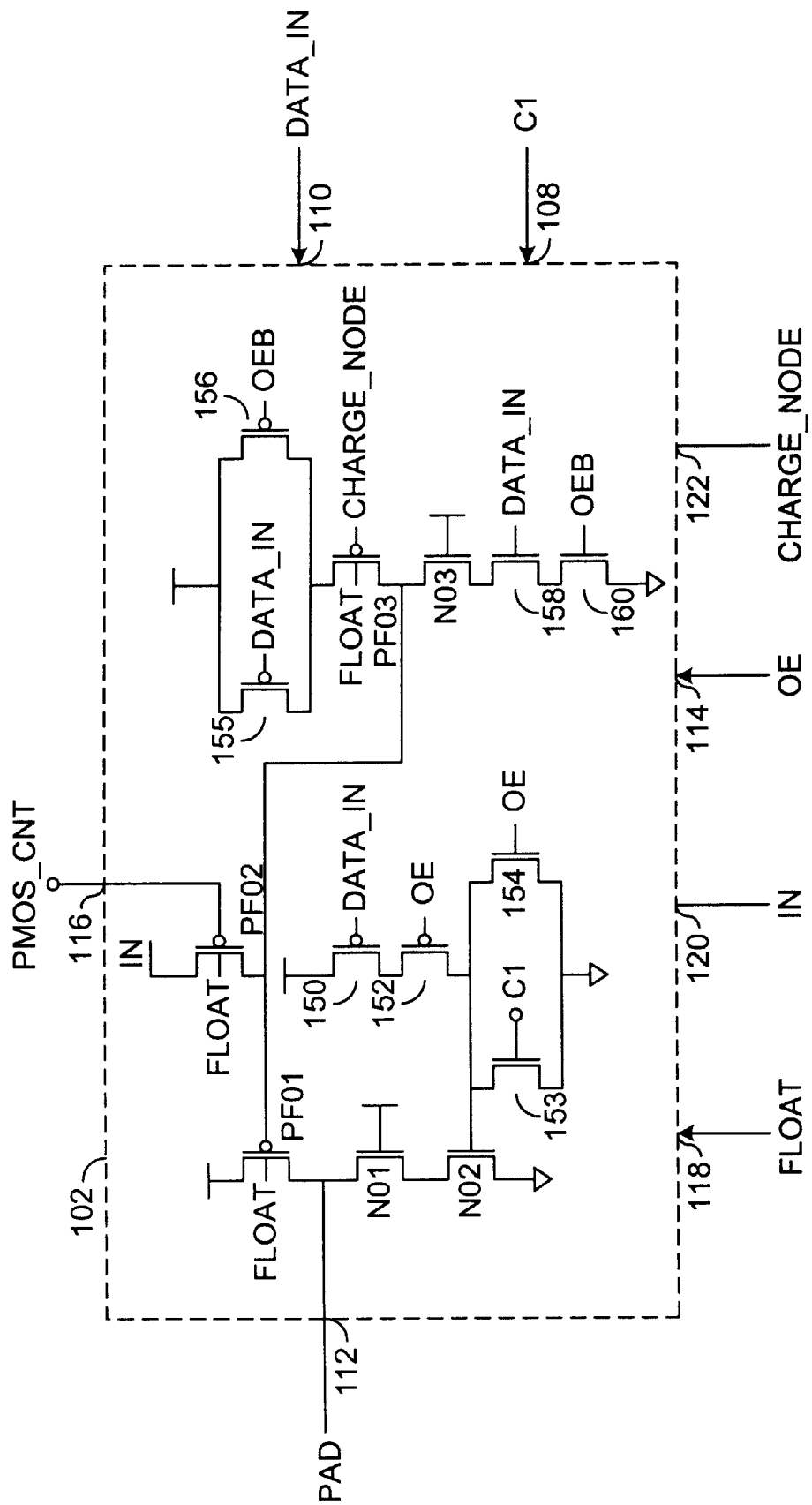
FIG. 3 is a schematic diagram of a logic block of FIG. 2.

Referring to FIG. 3, a more detailed diagram of the logic circuit 102 of FIG. 2 illustrating a preferred embodiment of the present invention is shown. The logic circuit 102 generally comprises a transistor PF01, a transistor N01, a transistor N02, a transistor PF02, a transistor PF03, a transistor N03, a transistor 150, a transistor 152, a transistor 153, a transistor 154, a transistor 155, a transistor 156, a transistor 158 and a transistor 160. The transistor PF01, the transistor PF02 and the transistor PF03 may receive the signal FLOAT at a respective substrate node (connection). The transistors 152 and 154 may receive the signal OE. The transistors 156 and 160 may receive a digital complement of the signal OE (e.g., OEb). The transistors 150, 155 and 158 may receive the signal DATA$_{13}$ IN. The transistor 153 may receive the signal C1. The signal PAD may be presented at a node formed by a connection of a source/drain of the transistor PF01 and a source/drain of the transistor N01. The signal CHARGE$_{13}$ NODE may be presented to a gate of the transistor PF03. The signal IN may be presented to a source/drain of the transistor PF02. The signal PMOS$_{13}$ CNT may be presented to a gate of the transistor PF02.

Figure 4:
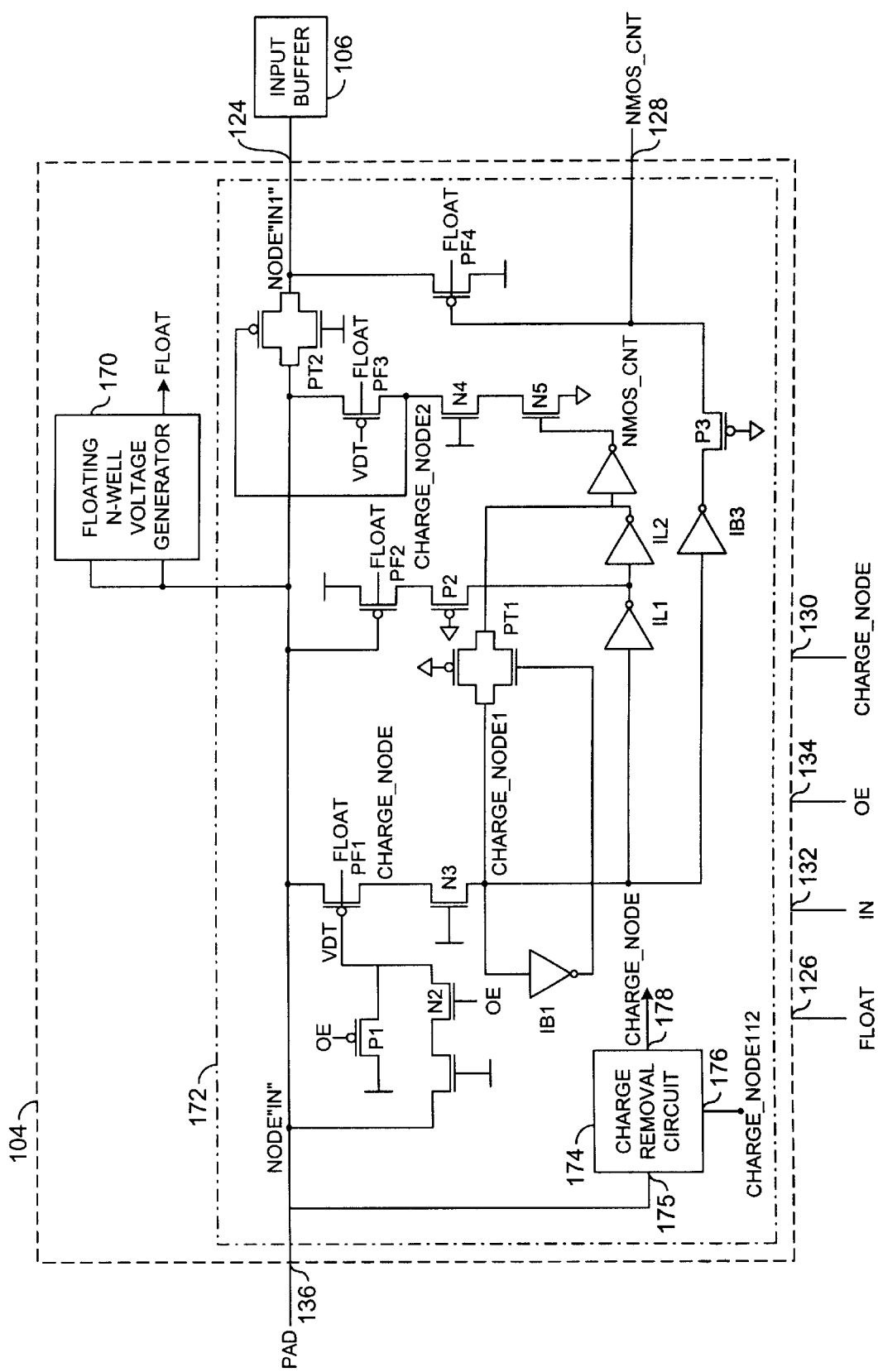
FIG. 4 is a schematic diagram of another logic block of FIG. 2.

Referring to FIG. 4, a more detailed diagram of the logic circuit 104 of FIG. 2 is shown. The logic circuit 104 generally comprises a voltage generation circuit 170 and a circuit 172. The circuit 170 may be a floating n-well voltage generation circuit. The signal (or voltage) IN may be presented to the circuit 170. The circuit 170 may be configured to generate the signal (or voltage) FLOAT in response to the signal IN. The signal FLOAT may be used to bias a number of n-wells (substrates) of a number of transistors.

The circuit 172 generally comprises a charge removal circuit 174 and a number of transistors and inverters. The charge removal circuit 174 may have an input 175 that may receive the signal or node IN. The charge removal circuit 174 may have an input 176 that may receive either (i) a signal or node (e.g., CHARGE$_{13}$ NODE1) and/or (ii) a signal or node (e.g., CHARGE$_{13}$ NODE2). The charge removal circuit 174 may have an output 178 that may present the signal or node CHARGE$_{13}$ NODE. The transistor P1 and the transistor N2 may receive the signal OE. The transistor PF1, the transistor PF2, the transistor PF3 and the transistor PF4 may have an n-well terminal that may receive the signal FLOAT.

Figure 5:
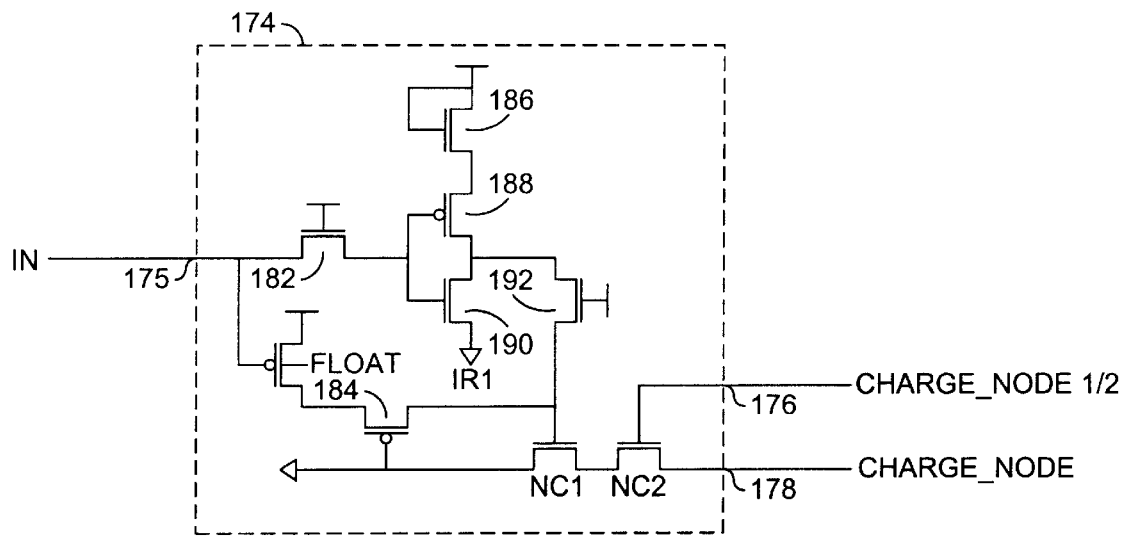
FIG. 5 is a schematic of a charge removal block of FIG. 4.

Referring to FIG. 5, a schematic diagram of a preferred embodiment of a charge removal circuit 174 is shown. The charge removal circuit 174 generally comprises a transistor NC1, a transistor NC2, a transistor 180, a transistor 182, a transistor 184, a transistor 186, a transistor 188, a transistor 190 and a transistor 192. The transistor 180 may have an N-well terminal that may receive the signal FLOAT. Either the signal CHARGE$_{13}$ NODE1 or the signal CHARGE$_{13}$ NODE2 may be presented to a gate of the transistor NC2. The signal CHARGE$_{13}$ NODE may be presented at a drain of the transistor NC2. The signal CHARGE$_{13}$ NODE may represent the signal CHARGE$_{13}$ NODE1 or the signal CHARGE$_{13}$ NODE2 after a charge has been removed.

Figure 6:
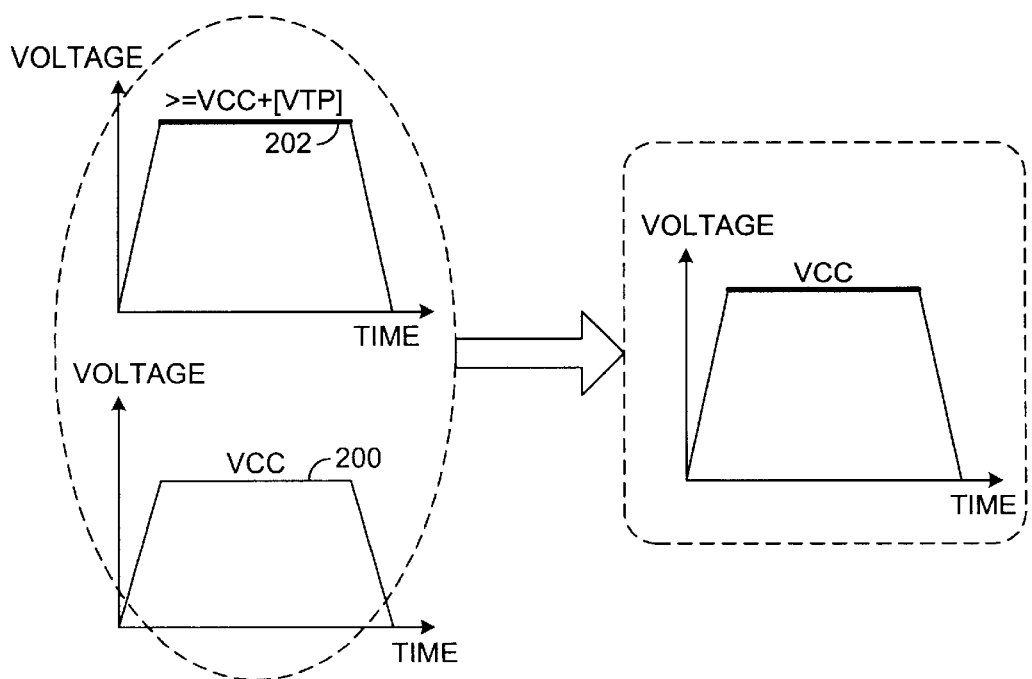
FIG. 6 is a graphical representation illustrating the desired operation of the present invention.

Referring to FIG. 6, a voltage vs. time diagram illustrating the desired operation of the circuit 100 is shown. The input PAD may be connected to the common system bus of a mixed voltage system. The input PAD is generally presented to the gates of transistors facing PAD. During normal operation a voltage 200 (e.g., VCC) is generally supplied to the input buffer 106. During an overvoltage condition a voltage 202 (e.g., >=VCC+VTP) may be supplied to the input buffer 106. The overvoltage condition when applied to the input buffer 106 may damage the gate oxide of the transistors of the input buffer 106. The interface 100 may be implemented to control the overvoltage condition such that the voltage supplied is limited to VCC.

Figure 7:
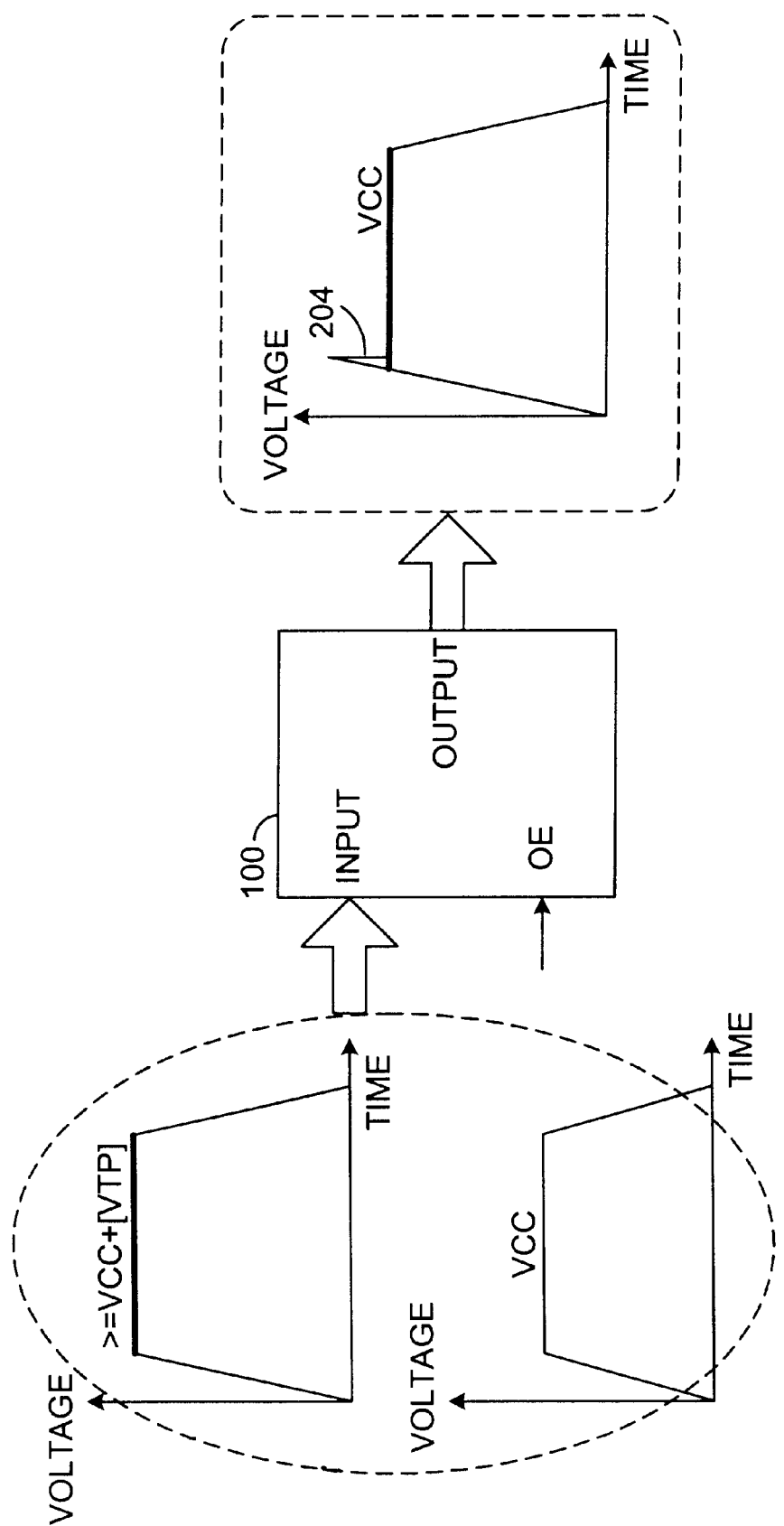
FIG. 7 is a graphical representation illustrating an example operation of the present invention.

Referring to FIG. 7, a voltage vs. time diagram illustrating an example operation of the circuit 100 is shown. When an overvoltage condition threshold 204 is reached, the output of the circuit 100 is generally limited to VCC.

The present invention involves the design of interface circuitry that may prevent an overvoltage condition of the signal or node IN1 of an input buffer that may be used in a mixed voltage environment system. The circuit 100 may ensure gate oxide protection for transistors that may receive the signal PAD. Such gate oxide protection may be achieved by avoiding a direct path from the signal PAD to the signal IN1. When an overvoltage SO a condition of the signal PAD exists, a correct logic level value may still be maintained on the signal IN1, which may ensure the correct operation of the input buffer 106.

An overvoltage condition of the signal PAD (e.g., a voltage level >=3.3V) is generally sensed by the PMOS transistor PF1. The transistor PF1 may have a floating n-well that generally starts tracking the voltage of the signal PAD during the overvoltage condition. The detection of the overvoltage condition of the signal PAD is generally used to present a control signal (e.g., CHARGE$_{13}$ NODE2) to the gate of the PMOS transistor of pass transistor PT2. The control signal CHARGE$_{13}$ NODE2 may be generated by a latch path formed by the inverters IL1, IL2, IB1 and the pass transistor PT1. The control signal CHARGE$_{13}$ NODE2 generally forces the gate of the PMOS portion of the pass transistor PT2 to follow the voltage of the signal PAD. The signal CHARGE$_{13}$ NODE2 may turn the pass transistor PT2 "OFF". A correct logical level of the signal IN1, in this condition, is generally maintained by the PMOS transistor PF4. The inverter IB3 and the PMOS transistor P3 may also contribute to maintaining a correct logic level of the signal An overvoltage detection threshold of Vcc−Vtn+|Vtp| or Vcc+|vtp| is generally provided by the transistors P1, N1, and N2, based on the output buffer signal OE. In a normal voltage condition of the signal PAD (e.g., 0 to VCC), the signal CHARGE$_{13}$ NODE2 is generally maintained at a LOW state by the above latch path and the NMOS transistor N5.

Once the overvoltage condition of the signal PAD has ended, the charge removal circuit 174 may provide fast residual charge removal from nodes CHARGE$_{13}$ NODE1 and CHARGE$_{13}$ NODE2. The charge removal circuit 174 may comprise two series connected NMOS transistors NC1, NC2, and a number of transistors 180–192.

The present invention may be implemented as a method of overvoltage detection with control signal generation to provide gate oxide protection against over voltage at an input of an input buffer comprising the steps of (i) inputting the PAD voltage in to transistors, at or above overvoltage detection threshold, (ii) coupling the output to a latch in response to the above step and (iii) generation of a control signal.

The voltage PAD may arrive after going through an ESD protection structure. The method may allow the voltage PAD to pass through (e.g., inputting) the transistors PF1 and N3 during an overvoltage condition. The overvoltage condition may be detected by the transistors P1, N1, and N2, based on the control signal OE to I/O buffer 106. A voltage rise of the signal CHARGE$_{13}$ NODE1 may be detected by a latch formed by the inverters IL1, IL2, and the pass transistor PT1 with inverter IB1. The latch may pull the signal CHARGE$_{13}$ NODE1 to a HIGH state.

The step of generating control signals may include using the HIGH voltage of the signal CHARGE$_{13}$ NODE1 to generate a control signal or voltage (e.g., NMOS$_{13}$ CNT) which may control the NMOS transistor N5. The control voltage NMOS$_{13}$ CNT may help generate an appropriate voltage at the gate of the PMOS portion of the pass transistor PT2, via the PMOS transistor PF3. The HIGH voltage of the signal CHARGE$_{13}$ NODE1 may be presented to the inverters IB1, IB3, IL1, and IL2 to generate the signals PMOS$_{13}$ CNT and NMOS$_{13}$ CNT.

The present invention may be used to generate a control signal to provide gate oxide protection, without any voltage degradation and change in a logical voltage level of the signal IN1. The gate oxide protection may be provided by cutting off the direct path from the signal PAD to the transistors of the input buffer 106 in the case of an over voltage condition on the signal PAD. Such a cut off may include turning OFF the pass transistor PT2 with the use of the control signal NMOS$_{13}$ CNT and the transistors N4, N5, and PF3.

The voltage of the signal or node IN1 may be held HIGH in the cut off condition to ensure proper operation of the input buffer. Maintaining the signal IN1 HIGH may include applying the signal PMOS$_{13}$ CNT to a gate of the transistor PF4, which generally pulls the voltage of the signal IN1 to a HIGH level.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The present invention may provide fast charge removal from the nodes charged in overvoltage condition by the transistors NC1 and NC2 and the inverter IR1 (e.g., formed by transistors 188 and 190). Such charge removal may remove the residual charge from the nodes charged, which may reduce the stress on the gate oxide and improve the circuit recovery from an overvoltage condition.

The present invention may be implemented in a mixed voltage compatible I/O buffer, with gate oxide protection and reduced high voltage related hazards. Such an architecture may be implemented without active voltage degradation to protect gate oxide. The architecture may reduce static and dynamic current levels and may maintain a comparable noise margin for a low voltage circuit.

The circuit 100 may implement a number of different overvoltage detection thresholds for input and output buffer operation. Implementing different detection thresholds may provide early detection of an overvoltage condition of the signal PAD for input buffer operation. A sufficient safety margin may also be provided for voltage levels across gate oxide and may compensate for the delay of the overvoltage detection circuit. Different detection thresholds may also improve the speed of the overvoltage detection.

Fast removal of residual stored charge may further reduce gate oxide stresses and may improve circuit recovery from an overvoltage condition. The circuit 100 may fit well for both an input buffer and output buffer implementation. The circuit 100 may remove the hazards related with operation in a mixed voltage system (e.g., gate oxide protection and high leakage current paths). The circuit may be implemented with interfaces operating at various voltages, such as 2.5V–3.3V. The circuit 100 may also be implemented using lower supply interfaces (e.g., 1.8V–2.5V) or lower.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate an output signal having a first voltage level and a first control signal in response to (i) an input signal having a second voltage level at or above a first threshold voltage, (ii) an enable signal, and (iii) a plurality of node voltages; and
    a second circuit configured to generate said plurality of node voltages in response to said first control signal, wherein said first circuit is configured to limit said first voltage level.

2. The apparatus according to claim 1, wherein said first circuit is further configured to couple said output signal to a latch if said second voltage level is at or above said first threshold voltage.

3. The apparatus according to claim 2, wherein said latch is configured to generate said first control signal.

4. The apparatus according to claim 1, wherein said first circuit comprises a first one or more transistors configured to detect said second voltage level in response to said enable signal.

5. The apparatus according to claim 1, wherein (i) said output signal and said input signal are connected for a non-overvoltage condition and (ii) said output signal and said input signal are disconnected for an overvoltage condition.

6. The apparatus according to claim 1, wherein said first circuit comprises a plurality of transistors configured to control said first voltage level in response to said second voltage level.

7. The apparatus according to claim 6, wherein said plurality transistors comprises a first one or more transistors and a second one or more transistors, wherein said first one or more transistors comprise pass transistors and said second one or more transistors comprise NMOS transistors.

8. The apparatus according to claim 6, wherein said first circuit is further configured to maintain said first voltage level.

9. The apparatus according to claim 6, wherein said first circuit further comprises a third one or more transistors configured to maintain said first voltage level.

10. The apparatus according to claim 1, further comprising:
   a removal circuit configured to remove a charge from said first circuit in an overvoltage condition.

11. The apparatus according to claim 10, wherein said removal circuit comprises (i) a plurality of transistors and (i) one or more inverters configured to remove said charge from said first circuit.

12. An apparatus comprising:
   a first circuit configured to generate an output signal having a first voltage level and a first control signal in response to (i) an input signal having a second voltage level, (ii) an enable signal, and (iii) a plurality of node voltages; a second circuit configured to generate said plurality of node voltages in response to said first control signal, wherein said first circuit is configured to limit said first voltage level; and
   a removal circuit configured to. remove a charge from said first circuit in an overvoltage condition.

13. A method for providing overvoltage gate oxide protection to I/O buffers in mixed voltage environments comprising the steps of:
   (A) generating an output signal having a first voltage level and a first control signal in response to (i) an input signal having a second voltage level at or above a first threshold voltage, (ii) an enable signal, and (iii) a plurality of node signals; and
   (B) generating said plurality of node signals in response to said first control signal, wherein said step (A) is configured to limit said first voltage level.

14. The method according to claim 13, wherein step (A) further comprises coupling said output signal to a latch if said second voltage level is at or above said first threshold voltage.

15. The method according to claim 13, further comprising the step of:
   (C) detecting a voltage level of said second voltage level in response to said enable signal.

16. The method according to claim 15, further comprising the step of:
   (D) controlling said first voltage level in response to said second voltage level.

17. The method according to claim 16, further comprising the step of:
   (E) maintaining said first voltage level.

18. The method according to claim 17, further comprising the step of:
   (F) removing a charge from said first circuit in an overvoltage condition.

19. An apparatus comprising:
   a first circuit configured to generate an output signal having a first voltage level and a first control signal in response to (i) an input signal having a second voltage level, (ii) an enable signal, and (iii) a plurality of node voltages; and
   a second circuit configured to generate said plurality of node voltages in response to said first control signal, wherein (i) said first circuit is configured to limit said first voltage level, (ii) said output signal and said input signal are connected for a non-overvoltage condition and (iii) said output signal and said input signal are disconnected for an overvoltage condition.

* * * * *